United States Patent
Kraft et al.

[11] Patent Number: 6,136,654
[45] Date of Patent: *Oct. 24, 2000

[54] METHOD OF FORMING THIN SILICON NITRIDE OR SILICON OXYNITRIDE GATE DIELECTRICS

[75] Inventors: Robert Kraft, Plano; Sunil Hattangady; Douglas T. Grider, both of McKinney, all of Tex.

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/984,967

[22] Filed: Dec. 4, 1997

Related U.S. Application Data

[60] Provisional application No. 60/019,429, Jun. 7, 1996, and provisional application No. 60/035,375, Dec. 5, 1996.

[51] Int. Cl.$^7$ .......... H01L 21/336; H01L 21/31; H01L 21/469
[52] U.S. Cl. .......... 438/287; 438/762; 438/763; 438/775; 438/776; 438/777
[58] Field of Search .......... 438/287, 762, 438/763, 775, 776, 777

[56] References Cited

U.S. PATENT DOCUMENTS

| | | |
|---|---|---|
| 3,788,894 | 1/1974 | Scherber . |
| 4,788,082 | 11/1988 | Schmitt .......... 427/248.1 |
| 4,900,396 | 2/1990 | Hayashi et al. . |
| 5,356,672 | 10/1994 | Schmitt, III et al. .......... 427/446 |
| 5,453,908 | 9/1995 | Tsu et al. .......... 361/321.5 |
| 5,464,792 | 11/1995 | Tseng et al. .......... 437/160 |
| 5,500,380 | 3/1996 | Kim . |
| 5,635,741 | 6/1997 | Tsu et al. .......... 257/310 |
| 5,731,220 | 3/1998 | Tsu et al. . |
| 6,040,249 | 3/2000 | Holloway .......... 438/769 |

FOREIGN PATENT DOCUMENTS

| | | |
|---|---|---|
| 0 824 268 | 2/1998 | European Pat. Off. . |
| 60-241269 | 11/1985 | Japan . |

OTHER PUBLICATIONS

Ma, et al., Deposition of Single Phase, Homogeneous Silicon Oxynitride by Remote Plasma–Enhanced Chemical Vapor Deposition, and Electrical Evaluation in Metal–Insulator–Semiconductor Devices, J. Vac. Sci. Technol. B, vol. 12, No. 4, Jul./Aug. 1994, pp. 2504–2510.

Wang, et al., Highly Reliable Silicon Nitride Thin Films Made by Jet Vapor Deposition, Jpn. J. Appl. Phys. vol. 34, Pt. 1, No. 2B, 1995, pp. 955–958.

(List continued on next page.)

*Primary Examiner*—John F. Niebling
*Assistant Examiner*—Josetta I. Jones
*Attorney, Agent, or Firm*—Robby T. Holland; Carlton H. Hoel; Frederick J. Telecky, Jr.

[57] ABSTRACT

An embodiment of the instant invention is a method of forming a dielectric layer, the method comprising the steps of: providing a semiconductor substrate (substrate 12), the substrate having a surface; forming an oxygen-containing layer (layer 14) on the semiconductor substrate; and subjecting the oxygen-containing layer to a nitrogen containing plasma (plasma 16) so that the nitrogen is either incorporated into the oxygen-containing layer (see regions 18, 19, and 20) or forms a nitride layer at the surface of the substrate (region 22). Using this embodiment of the instant invention, the dielectric layer can be substantially free of hydrogen. Preferably, the oxygen-containing layer is an $SiO_2$ layer or it is comprised of oxygen and nitrogen (preferably an oxynitride layer). The plasma is, preferably, a high-density plasma. Preferably, a source of nitrogen is introduced to the plasma to form the nitrogen containing plasma. The source of nitrogen is preferably comprised of a material consisting of: $N_2$, $NH_3$, NO, $N_2O$, or a mixture thereof.

21 Claims, 4 Drawing Sheets

OTHER PUBLICATIONS

Hattangady, et al., Low Hydrogen Content Silicon Nitride Deposited at Low Temperature by Novel Remote Plasma Technique, J. Vac. Sci. Technol. A7(3), May/Jun. 1989, pp. 570–575.

Cui, et al., Low Temperature Deposition of Gate Dielectrics by the Jet Vapor Deposition™ Process, $4^{th}$ Int. Conf. On Advanced Thermal Processing of Semiconductors—RTP '96, pp. 219–223.

Sodini, et al., Silicon Oxynitride Gate Dielectrics for Scaled CMOS, IEEE 1992, pp. 25.1.1–25.1.4.

METHOD OF FORMING THIN SILICON NITRIDE OR SILICON OXYNITRIDE GATE DIELECTRICS

This is a Non Provisional application filed under 35 USC 119(e) and claims priority of prior provisional, Ser. No. 60/035,375 of inventor Kraft, et al, filed Dec. 5, 1996.

CROSS-REFERENCE TO RELATED PATENT/PATENT APPLICATIONS

The following commonly assigned patent/patent applications are hereby incorporated herein by reference:

Patent No./Serial No. 60/019,429, Filing Date Jun. 7, 1996, TI Case No. TI-23502,

FIELD OF THE INVENTION

The instant invention pertains to semiconductor device fabrication and processing and more specifically to the novel formation of a gate dielectric layer.

BACKGROUND OF THE INVENTION

Presently, there is a great demand for shrinking semiconductor devices to provide an increased density of devices on the semiconductor chip that are faster and consume less power. The scaling of the devices in the lateral dimension requires vertical scaling as well so as to achieve adequate device performance. This vertical scaling requires the thickness of the gate dielectric to be reduced so as to provide the required device performance. However, thinning of the gate dielectric provides a smaller barrier to dopant diffusion from a polysilicon gate structure or metal diffusion from a metal gate structure and through the underlying dielectric and it may result in devices with diminished electrical performance and reliability.

One means of reducing these problems is to use silicon nitride as the gate dielectric layer. Silicon nitride has a higher dielectric constant than typical thermally grown $SiO_2$ films and it provides greater resistance to impurity diffusion. However, the electrical properties of standard deposited silicon nitride films are far inferior to thermal oxides. Hence, to make the conventional silicon nitride film useful as a gate insulator, an oxide layer must be formed between the nitride layer and the substrate.

Recently, a technique was developed for depositing a silicon nitride film that has electrical properties similar to that of typical silicon oxide films. This new technique is referred to as Jet Vapor Deposition (JVD). See Xie-wen Wang, et al., *Highly reliable Silicon Nitride Thin Films Made by Jet Vapor Deposition*, JPN. J. APPL. PHYS., Vol. 34, 955–958 (1995). JVD relies on a supersonic jet of a light carrier gas, such as helium, to transport deposition vapor from the source to the substrate. While this technique yields a silicon nitride film that can be used as a gate dielectric, it suffers from the following problems: it is a relatively complex process which involves rastering the plasma jet across the wafer so as to deposit the film on the entire wafer (and this is difficult to reliably accomplish); this process can not be easily scaled up for broad-area film formation on large diameter wafers (e.g. 8–12 inch wafers); hydrogen is incorporated into the resultant film; and this process is a low throughput process because of the tremendously slow deposition rates.

Another method of maintaining the benefit of the electrical properties of the oxide film while also getting the barrier properties of a nitride film is accomplished by incorporating nitrogen into a gate oxide layer. Typically, this is accomplished by areoxidized nitrided oxide process. This process involves using ammonia to include nitrogen within the gate oxide layer. Unfortunately, in order to get the ammonia to penetrate the gate oxide, temperatures in excess of 1000° C. are required. In addition, once the high temperature reaction has begun, it is difficult to control the concentration of the nitrogen incorporated into the gate oxide. Excessive nitrogen near the interface between the semiconductor substrate and the gate oxide can adversely affect the threshold voltage and degrade the channel mobility of the device through Coloumbic effects of the fixed charge and interface-trap charge associated with the nitrogen on the carriers within the channel region.

Other experimental work has been done involving nitridation through exposure to a remote plasma. See S. V. Hattangady, et al., *Controlled Nitrogen Incorporation at the Gate Oxide Surface*, 66 Appl. Phys. Lett. 3495 (Jun. 19, 1995). This process provided for nitrogen incorporation specifically at the gate-conductor interface using a high pressure (100 milliTorr) and low power (30 Watt) process with relatively low ion-density and ion-flux. Low ion-density and ion-flux dictates a long duration (around 10–60 minute) so as to obtain desired concentration of incorporated nitrogen. This long exposure to the plasma increases the probability of charge-induced damage to the oxide. Additionally, throughput is greatly reduced using this method.

It is, therefore, an object of the instant invention to provide a film that has the beneficial barrier properties of a nitride film while having the beneficial electrical properties of an oxide film.

SUMMARY OF THE INVENTION

An embodiment of the instant invention is a method of forming a dielectric layer, the method comprising the steps of: providing a semiconductor substrate, the substrate having a surface; forming an oxygen-containing layer on the semiconductor substrate; and subjecting the oxygen-containing layer to a nitrogen containing plasma so that the nitrogen is either incorporated into the oxygen-containing layer or forms a nitride layer at the surface of the substrate. Using this embodiment of the instant invention, the dielectric layer can be substantially free of hydrogen. Preferably, the oxygen-containing layer is an $SiO_2$ layer or it is comprised of oxygen and nitrogen (preferably an oxynitride layer). The plasma is, preferably, a high-density plasma. Preferably, a source of nitrogen is introduced to the plasma to form the nitrogen containing plasma. The source of nitrogen is preferably comprised of a material consisting of: $N_2$, $NH_3$, $NO$, $N_2O$ or a mixture thereof.

Another embodiment of the instant invention is a method of forming a transistor having a conductive gate structure disposed on a gate dielectric layer, the method comprising the steps of: providing a semiconductor substrate, the substrate having a surface; providing a dielectric layer on the substrate, the dielectric layer comprised of an oxide; subjecting the dielectric layer to a nitrogen containing plasma so that nitrogen is either incorporated into the gate insulating layer or forms a nitride layer at the surface of the substrate; and wherein the gate dielectric layer is either comprised of the dielectric layer incorporated with the nitrogen or the nitride layer formed at the surface of the substrate. Preferably, the conductive gate structure is comprised of doped polysilicon or a metal. Using this embodiment of the instant invention, the gate dielectric layer can be substantially free of hydrogen. Preferably, the dielectric layer is an SiO$_2$ layer or is an oxynitride layer.

Another embodiment of the instant invention is a method of forming a capacitor having a capacitor dielectric comprising the steps of: providing a semiconductor substrate; forming a first electrode over the semiconductor substrate; providing a dielectric layer on the first electrode, the dielectric layer comprised of an oxide; subjecting the dielectric layer to a nitrogen containing plasma so that nitrogen is either incorporated into the dielectric layer or forms a nitride layer at the surface of the first electrode; forming a second electrode on the dielectric layer after the dielectric layer is subjected to the plasma; and wherein the capacitor dielectric is either comprised of the dielectric layer incorporated with the nitrogen or the nitride layer formed at the surface of the first electrode.

BRIEF DESCRIPTION OF THE DRAWINGS

FIGS. 1, 2, and 3*a* illustrate the method of one embodiment of the instant invention. FIGS. 1, 2, and 3*b* illustrate another embodiment of the instant invention. FIGS. 1, 2, and 3*c* illustrate another embodiment of the instant invention.

DETAILED DESCRIPTION OF THE DRAWINGS

Figure 1:
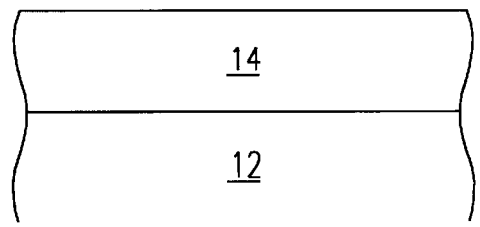
FIGS. 1, 2, 3*a*, 3*b* and 3*c* are cross-sectional views of a semiconductor device as it is fabricated.

The following description is centered around two embodiments of the instant invention. While the description of both embodiments involve the novel formation of a gate dielectric, the instant methods are not limited to the formation of a gate dielectric layer. The instant embodiments can be utilized to form other layers required in the formation of semiconductor devices. For example, the instant invention can be utilized to form the dielectric material in a capacitor structure or it can be used to isolate conductive structures. While the following description describes the formation of a gate dielectric layer, one of ordinary skill in the art should be able to use the teachings of the following description and form other layers in a semiconductor device. Like reference numerals are utilized in the figures to illustrate like features or similar process steps.

Figure 2:
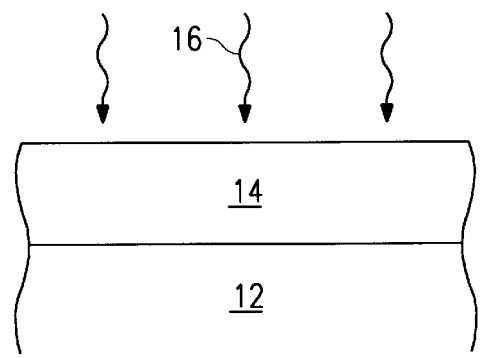

Referring to the invention of FIGS. 1, 2, and 3*a* and FIG. 4*a*, insulating layer 14 is formed on semiconductor structure 12 (which is preferably a silicon substrate or an epitaxial silicon layer formed on a silicon substrate). Preferably, insulating layer 14 is a 10 to 150 thick oxide-containing layer [preferably either an oxide layer, an oxynitride layer, or other insulating layer] (more preferably a 10 to 80 thick oxide layer—even more preferably a 10 to 45 thick oxide layer) which is either thermally grown, deposited, or a combination thereof. This step corresponds to block 502 of FIG. 4*a*. Referring to FIG. 2 and step 504 of FIG. 4*a*, insulating layer 14 is subjected to a plasma which is incorporated with a nitrogen-containing substance. Preferably, the nitrogen-containing substance is either N$_2$, NH$_3$, NO, N$_2$O, or a mixture thereof, and the plasma is preferably a high density plasma. The wafer can be unbiased in which case the ionized substances are accelerated by the plasma potential (which is typically on the order of 20 Volts) and then implanted into the insulating surface. A bias voltage can be applied to the wafer to further accelerate the ions from the plasma and implant them deeper into the insulating layer. Either a DC or an RF bias voltage can be used to bias the wafer. Most preferably, step 504 is performed with the following processing conditions: the starting oxide thickness is between 10 to 150 thick; the plasma density is between $1\times10^{10}$ to $1\times10^{12}$ cm$^{-3}$; the nitrogen is on the order of 1 to 100 sccm; the process pressure is preferably on the order of 1 to 50 mTorr; the temperature is preferably around 70 to 900K; the substrate (wafer) bias is on the order of 0 to 50 Volts; and the duration of exposure is between 1 to 60 seconds.

Figure 3A:
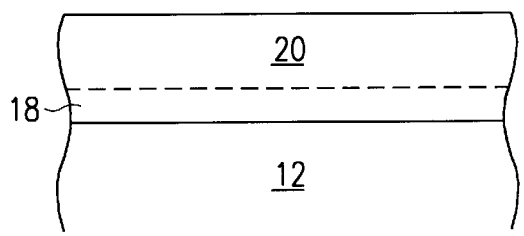

FIG. 3*a* illustrates the results of step 504. Depending on the bias of the wafer and the density of the plasma, nitrogen is incorporated into insulating layer 14. This results in a Si/N/O portion 20 of layer 14 and a Si/O/N portion 18 of layer 14. Preferably, the amount of nitrogen exceeds the amount of oxygen in portion 20. In fact it may be preferable that there is much more nitrogen than oxygen (may be even very little or no oxygen) in portion 20. Portion 18 may be substantially the same as portion 20 or these two portions may be comprised of different amounts of silicon, nitrogen, and oxygen. In fact, portion 18 may remain a relatively pure SiO$_2$ film, it may be comprised mostly of silicon and nitrogen, or it may comprise some proportion of silicon, nitrogen and oxygen which lies in between these two extremes. The amount of nitrogen added depends on the process conditions, and, therefore, these process conditions may be manipulated so as to optimize the process for any transistor design.

Furthermore, the transition between portions 18 and 20 may not be sharp and may be graded with respect to the nitrogen concentration. Alternatively, the transition between portions 18 and 20 may be characterized by a region (region 19 of FIG. 3*c*) with little or no nitrogen, that is bound on either side by nitrogen-containing portions (portions 18 and 20). More specifically, the embodiment of FIG. 3*c* can be comprised of oxynitride portion 18, mostly oxide-containing portion 19, and either nitride portion or oxynitride portion 20.

Figure 3B:
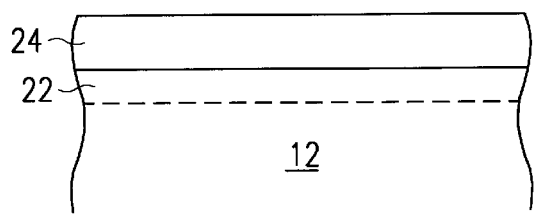
Figure 3C:
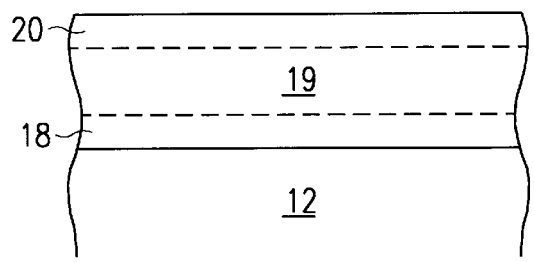
Figure 4A:
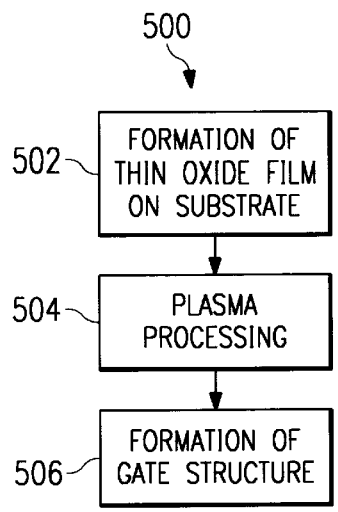
FIGS. 4*a* and 4*b* are flow charts that illustrate the methods of two embodiments of the instant invention
Figure 4B:
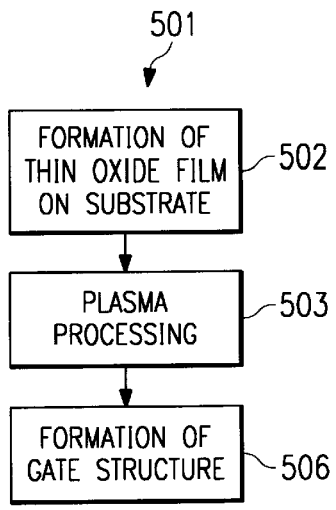

Referring to the embodiment of FIGS. 1, 2, and 3*b* and of FIG. 4*1*), gate insulator 14 is formed on semiconductor structure 12 (preferably either a silicon substrate or an epitaxial silicon layer formed on a silicon substrate) using standard processing. Preferably, gate insulator 14 is comprised of 10 to 200 (more preferably 10 to 80—even more preferably 10 to 45) thick thermally grown SiO$_2$ film, deposited SiO$_2$ film, or a film formed as a combination thereof. Next, referring to FIG. 2 and step 503 of FIG. 4*b*, the wafer is subjected to a nitrogen-containing plasma. Preferably, the plasma is a high density plasma (preferably formed from a helicon source, a helical-resonator source, electron-cyclotron resonance source, or an inductively coupled source—or it can be a low density plasma), and the nitrogen-containing source is either N$_2$, NH$_3$, NO, N$_2$O, or a mixture thereof. With the appropriate biasing of the wafer (preferably around 0–500 Volts) the ionized species contained in the plasma will pass through dielectric layer 14 and react at the surface of semiconductor structure 12. Preferably, this will result in the formation of a silicon nitride layer 22, which is formed as part of semiconductor structure 12. Dielectric layer 14 (which is referred to as layer 24 in FIG. 3*b*) may trap some of the nitrogen or the nitrogen may simply pass through it. In addition, as plasma 16 is introduced gate insulator may be completely sputtered away, partially sputtered away to form layer 24 (preferably comprised of silicon, oxygen, and some amount of nitrogen), or it may not be removed. Preferably, the process conditions utilized in step 503 of FIG. 4b is as follows: the oxide thickness is around 10 to 80 thick (preferably around 20 thick); the plasma density is around $1 \times 10^{10}$ to $1 \times 10^{12}$ cm$^{-3}$; the nitrogen flow is around 1 to 100 sccm; the process pressure is around 4 mTorr; the temperature is around 300K; the substrate (wafer) bias is around 0 to 500 Volts; and the duration of the exposure to the plasma is around 1–60 seconds.

In both step 504 of FIG. 4a and step 503 of FIG. 4b, substrate bias, length (in time) of exposure to the plasma, plasma power, and use of a post nitridation anneal can be altered/used so as to either drive the nitrogen further into or not drive as far into the insulating layer or the underlying semiconductor structure and repair any dielectric and/or substrate damage. In addition, a low density plasma or a high density plasma may be used depending on the amount of drive-in that is required for the nitrogen.

The instant embodiments may be utilized to form any of the following: a homogeneous silicon oxynitride layer, a homogeneous silicon nitride layer, an interfacial silicon oxynitride or silicon nitride layer at the uppermost surface of the gate insulating layer, an interfacial silicon oxynitride or silicon nitride layer at the uppermost surface and/or the bottommost surface of the gate insulating layer. Preferably, the gate insulator formed using an embodiment of the instant invention will have a composition of 0.1 to 57 atomic percent of nitrogen.

Figure 5:
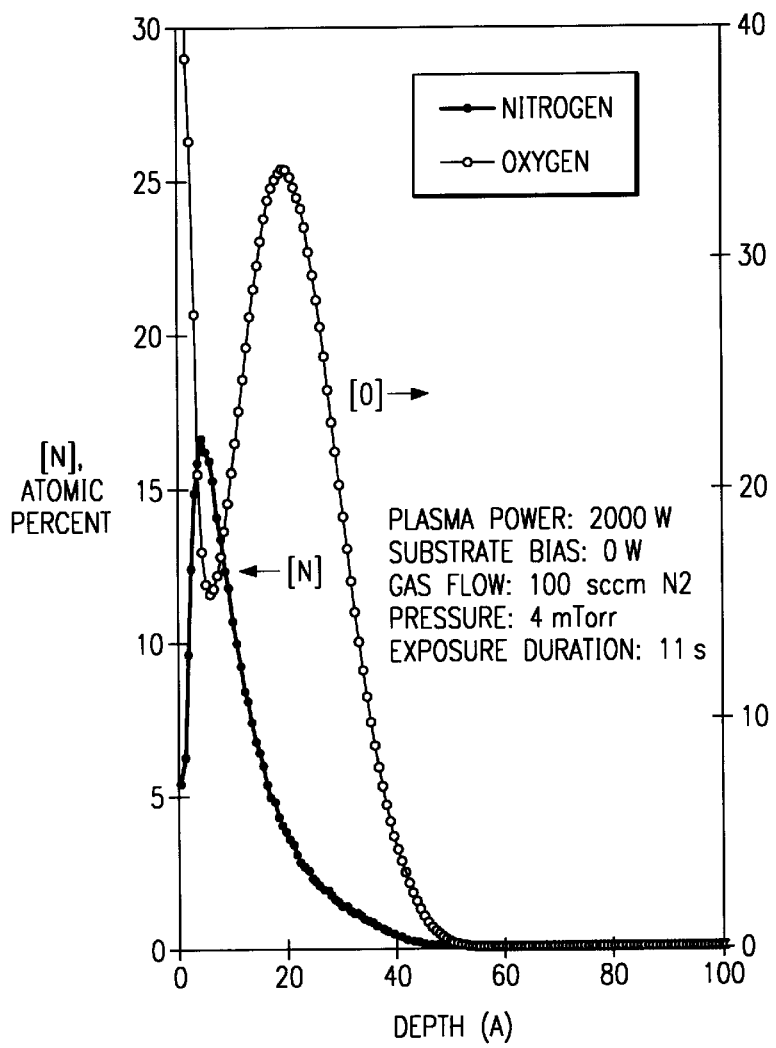
FIGS. 5–8 are graphs illustrating the amount of oxygen and nitrogen in gate dielectric layers formed using the methods of the instant invention.
Figure 6:
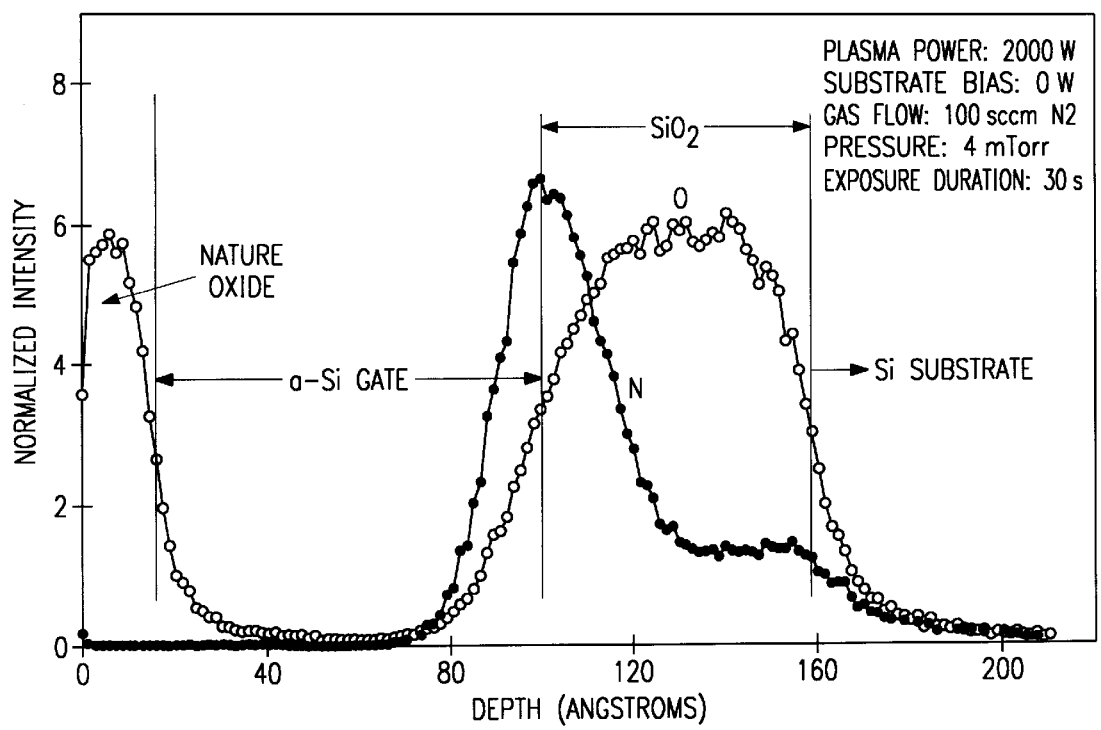
Figure 8:
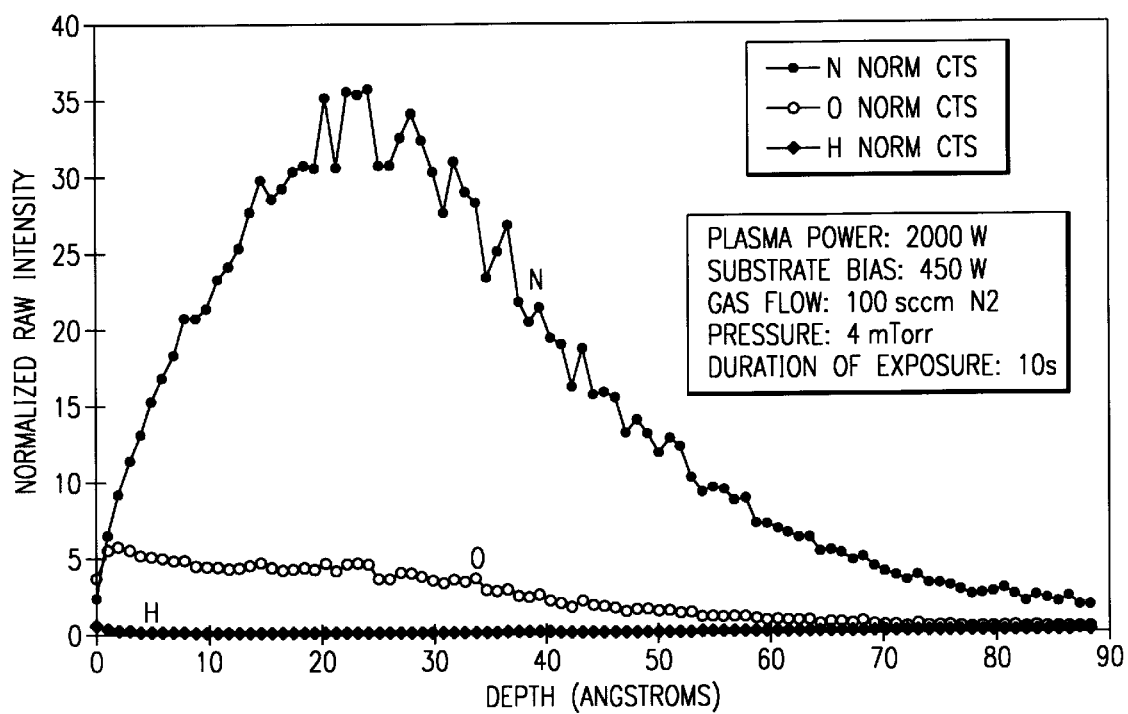
Figure 7:
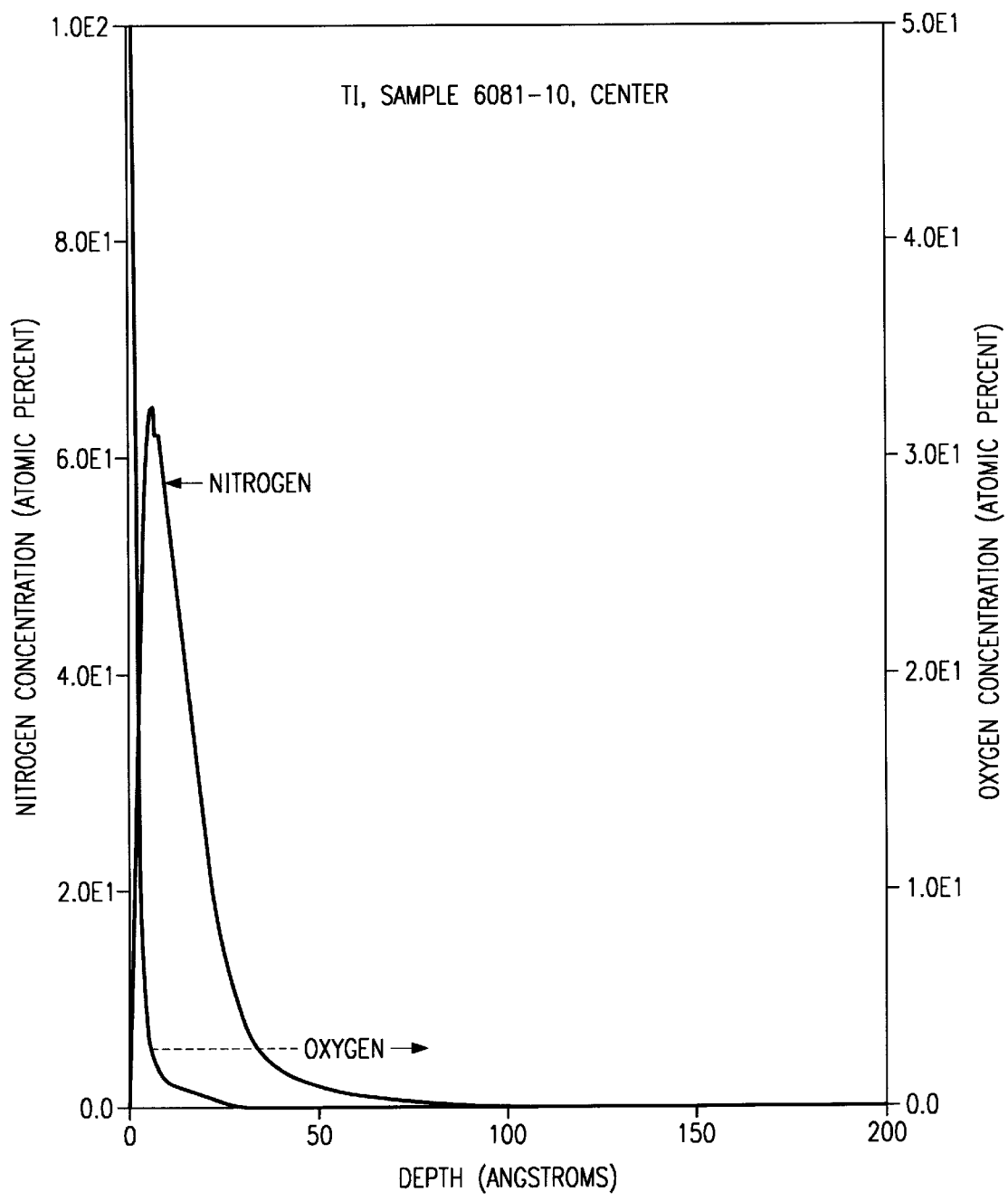

FIGS. 5–8 are graphs illustrating the level of oxygen and nitrogen in gate dielectric films formed using the methods of the instant invention. FIG. 5 illustrates data taken from a SIMS analysis of a 60 oxide film nitrided under the following conditions: the plasma power was 2000 W (for a high-density helicon-based plasma); the substrate bias was 0 Watts; the gas flow was 100 sccm of $N_2$; the ambient pressure was 4 mTorr; and the duration of the exposure to the plasma was 11 seconds. FIG. 5 shows nitrogen incorporation at the top surface/interface. FIG. 6 illustrates data taken from a time-of-flight SIMS analysis of a 60 oxide film nitrided under the following conditions: the plasma power was 2000 W (for a high-density helicon-based plasma); the substrate bias was 0 Watts; the gas flow was 100 sccm of $N_2$; the ambient pressure was 4 mTorr; and the duration of the exposure to the plasma was 30 seconds. FIG. 6 shows nitrogen incorporation at the top and bottom interfaces. FIG. 7 illustrates data taken from a SIMS analysis of a 35 oxide film nitrided under the following conditions: the plasma power was 2000 W (for a high-density helicon-based plasma); the substrate bias was 100 Watts (13.56 MHz); the gas flow was 100 sccm of $N_2$; the ambient pressure was 4 mTorr; and the duration of the exposure to the plasma was 60 seconds. FIG. 7 shows a substantially complete formation of silicon nitride with a small amount of oxygen remaining behind in the film. FIG. 8 illustrates data taken from a time of flight SIMS analysis of a 7 oxide film nitrided under the following conditions: the plasma power was 2000 W (for a high-density helicon-based plasma); the substrate bias was 450 Watts (13.56 MHz); the gas flow was 100 sccm of $N_2$; the ambient pressure was 4 mTorr; and the duration of the exposure to the plasma was 10 seconds.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of forming an integrated circuit structure, said method comprising the steps of:
   providing a substrate, said substrate having a semiconducting surface;
   forming an oxygen-containing layer on said semiconducting surface; and
   subjecting said oxygen-containing layer to a nitrogen containing plasma of an ion density of at least about $10^{10}$ cm$^{-3}$, to form a dielectric layer having at least a portion in which the concentration of nitrogen is higher than the concentration of oxygen.

2. The method of claim 1, wherein said dielectric layer is substantially free of hydrogen.

3. The method of claim 1, wherein said oxygen-containing layer is an $SiO_2$ layer.

4. The method of claim 1, wherein said oxygen-containing layer is comprised of oxygen and nitrogen.

5. The method of claim 1, wherein said oxygen-containing layer is an oxynitride layer.

6. The method of claim 1, wherein a source of nitrogen is introduced to said plasma to form said nitrogen containing plasma.

7. The method of claim 6, wherein said source of nitrogen comprises a material selected from the group consisting of: $N_2$, $NH_3$, $NO$, $N_2O$, and a mixture thereof.

8. The method of claim 1, wherein the integrated circuit structure includes a transistor having a conductive gate structure disposed on a gate dielectric layer;
   wherein said dielectric layer forms said gate dielectric layer; and further comprising:
      forming the conductive gate structure upon said gate dielectric layer.

9. The method of claim 8, wherein said conductive gate structure is comprised of doped polysilicon.

10. The method of claim 8, wherein said conductive gate structure is comprised of metal.

11. The method of claim 8, wherein said gate dielectric layer is substantially free of hydrogen.

12. The method of claim 11, wherein said dielectric layer is an $SiO_2$ layer.

13. The method of claim 8, wherein said dielectric layer is an oxynitride layer.

14. The method of claim 1, wherein the integrated circuit structure includes a capacitor having a capacitor dielectric; and further comprising the steps of:
   forming a first electrode over said substrate, said semiconducting surface present at said first electrode; and
   forming a second electrode on said dielectric layer;
   wherein said dielectric layer forms said capacitor dielectric.

15. The method of claim 1, wherein the ion density of the nitrogen containing plasma is between about $10^{10}$ cm$^{-3}$ and about 12 cm$^{-3}$.

16. The method of claim 1, wherein the subjecting step is performed at a process pressure ranging from about 1 mtorr to about 50 mtorr.

17. A method of fabricating an integrated circuit structure at a semiconducting surface of a substrate, comprising the steps of:
   forming a dielectric layer comprising an oxide over a location of the semiconducting surface; and
   exposing the dielectric layer to a nitrogen containing plasma while biasing the substrate, to react nitrogen from the plasma with the semiconducting surface to form a nitride layer thereat.

18. The method of claim 17, wherein the dielectric layer is substantially removed during the exposing step.

19. The method of claim 17, wherein the nitrogen containing plasma has an ion density of at least $10^{10}$ cm$^{-3}$.

20. The method of claim 17, wherein the integrated circuit structure includes a transistor;

wherein the nitride layer becomes at least part of a gate dielectric layer of the transistor;

and further comprising:

forming a conductive gate structure upon said gate dielectric layer.

21. The method of claim 17, wherein the integrated circuit structure includes a capacitor;

and further comprising the steps of:

before the step of forming a dielectric layer, forming a first electrode over said substrate, said semiconducting surface present at said first electrode; and after the exposing step, forming a second electrode upon a capacitor dielectric layer that includes the nitride layer.

* * * * *